US012176372B2

(12) United States Patent
Chou et al.

(10) Patent No.: US 12,176,372 B2
(45) Date of Patent: Dec. 24, 2024

(54) DIELECTRIC STRUCTURE OVERLYING IMAGE SENSOR ELEMENT TO INCREASE QUANTUM EFFICIENCY

(71) Applicant: Taiwan Semiconductor Manufacturing Co., Ltd., Hsin-Chu (TW)

(72) Inventors: Cheng-Hsien Chou, Tainan (TW); Sheng-Chau Chen, Tainan (TW); Ming-Che Lee, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 465 days.

(21) Appl. No.: 17/197,291

(22) Filed: Mar. 10, 2021

(65) Prior Publication Data
US 2022/0293647 A1   Sep. 15, 2022

(51) Int. Cl.
*H01L 27/146* (2006.01)
(52) U.S. Cl.
CPC ...... *H01L 27/1464* (2013.01); *H01L 27/1463* (2013.01); *H01L 27/14636* (2013.01); *H01L 27/14685* (2013.01)
(58) Field of Classification Search
CPC ........... H01L 27/14685; H01L 27/1462; H01L 27/14625; H01L 27/1464
See application file for complete search history.

(56) References Cited

U.S. PATENT DOCUMENTS

2010/0059842 A1* 3/2010 Choi ................. H01L 27/14625
                                                          257/E31.127
2012/0147208 A1* 6/2012 Otsuka .............. H01L 27/14629
                                                          257/E31.127
(Continued)

FOREIGN PATENT DOCUMENTS

TW          201443487 A     11/2014

OTHER PUBLICATIONS

Georgia State University. "Refraction of Light." Published in 2016. Retrieved online on Jul. 2, 2020 from http://hyperphysics.phy-astr.gsu.edu/hbase/geoopt/refr.html.
(Continued)

*Primary Examiner* — Mounir S Amer
*Assistant Examiner* — Alexander Belousov
(74) *Attorney, Agent, or Firm* — Eschweiler & Potashnik, LLC

(57) ABSTRACT

Various embodiments of the present disclosure are directed towards a pixel sensor. The pixel sensor includes a substrate having a front-side opposite a back-side. An image sensor element comprises an active layer disposed within the substrate, where the active layer comprises germanium. An anti-reflective coating (ARC) structure overlies the back-side of the substrate. The ARC structure includes a first dielectric layer overlying the back-side of the substrate, a second dielectric layer overlying the first dielectric layer, and a third dielectric layer overlying the second dielectric layer. A first index of refraction of the first dielectric layer is less than a second index of refraction of the second dielectric (Continued)

layer, and a third index of refraction of the third dielectric layer is less than the first index of refraction.

20 Claims, 10 Drawing Sheets

(56) References Cited

U.S. PATENT DOCUMENTS

| | | | | |
|---|---|---|---|---|
| 2015/0091121 | A1* | 4/2015 | Manda | H01L 27/1463 257/443 |
| 2016/0013229 | A1* | 1/2016 | Tu | H01L 27/14621 438/70 |
| 2018/0211986 | A1* | 7/2018 | Lee | H01L 27/14689 |
| 2018/0219034 | A1* | 8/2018 | Fan | H01L 27/1462 |
| 2018/0358396 | A1* | 12/2018 | Huang | H01L 27/14627 |
| 2019/0067354 | A1* | 2/2019 | Cheng | H01L 27/14629 |
| 2019/0148434 | A1* | 5/2019 | Hsu | H01L 27/14629 257/432 |
| 2019/0157323 | A1* | 5/2019 | Ogi | H01L 27/14609 |
| 2020/0083263 | A1* | 3/2020 | Tanaka | H01L 27/14603 |
| 2020/0105815 | A1* | 4/2020 | Huang | H01L 23/552 |
| 2020/0395393 | A1* | 12/2020 | Cheng | G01S 7/4914 |
| 2021/0091135 | A1* | 3/2021 | Yokogawa | H01L 27/14612 |
| 2021/0265416 | A1* | 8/2021 | Chen | H01L 31/1892 |
| 2022/0302200 | A1* | 9/2022 | Ge | C03C 17/3452 |

OTHER PUBLICATIONS

Augusta County Public Schools. "Refraction." The date of publication is unknown. Retrieved online on Jul. 2, 2020 from https://www.augusta.k12.va.us/cms/lib01/VA01000173/Centricity/Domain/396/Refraction.pdf.

Boston University Physics Department. "PY106 Class31." The date of publication is unknown. Retrieved online on Jul. 2, 2020 from http://physics.bu.edu/~okctsui/PY106_lecture_notes/class31_Refraction_2014.pdf.

\* cited by examiner

DIELECTRIC STRUCTURE OVERLYING IMAGE SENSOR ELEMENT TO INCREASE QUANTUM EFFICIENCY

BACKGROUND

Many modern day electronic devices (e.g., digital cameras, optical imaging devices, etc.) comprise image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) image sensors and complementary metal-oxide-semiconductor (CMOS) image sensors (CIS). Compared to CCD pixel sensors, CIS are favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
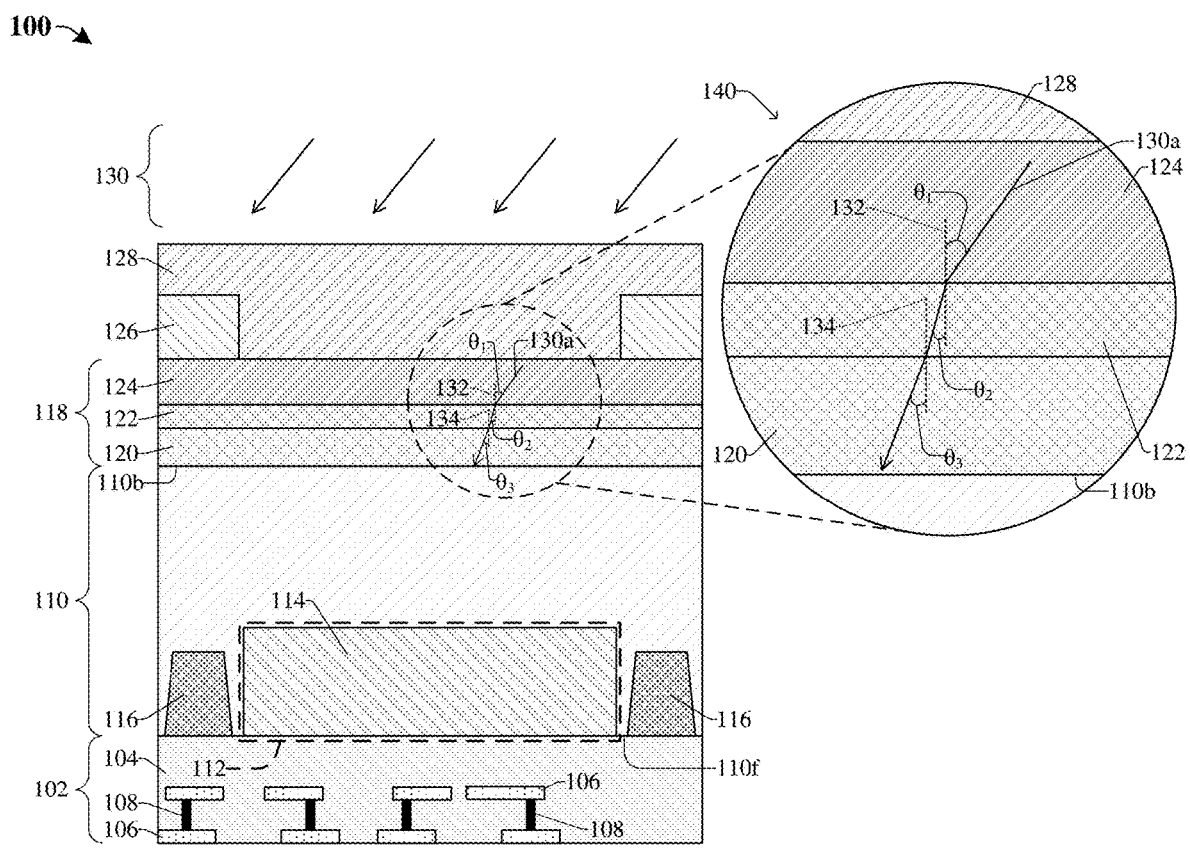
FIG. 1 illustrates a cross-sectional view of some embodiments of a pixel sensor having an anti-reflective coating (ARC) structure overlying an image sensor element, where the ARC structure is configured to enhance the quantum efficiency (QE) of the image sensor element.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element, but rather are merely generic identifiers. For example, "a first dielectric layer" described in connection with a first figure may not necessarily correspond to a "first dielectric layer" described in connection with some embodiments, but rather may correspond to a "second dielectric layer" in other embodiments.

CMOS image sensors (CIS) typically comprise an array of pixel regions, which respectively have an image sensor element arranged within a substrate. An anti-reflective coating (ARC) structure overlies the image sensor elements and is configured to prevent reflection of incident light away from the substrate. Upon receiving light, the image sensor elements are configured to generate electric signals corresponding to the received light. The electric signals from the image sensor elements can be processed by a signal processing unit to determine an image captured by the CIS. Quantum efficiency (QE) is a ratio of the numbers of photons that contribute to an electric signal generated by an image sensor element within a pixel region to the number of photons incident on the pixel region. It has been appreciated that the ARC structure may enhance QE of a CIS by preventing the reflection of incident light away from underlying image sensor elements.

One challenge with the above pixel sensor is reflection of the incident radiation away from an underlying image sensor element. In some embodiments, the ARC structure comprises a first dielectric layer disposed over the underlying image sensor element and a second dielectric layer overlying the first dielectric layer. The first dielectric layer has a first index of refraction that is greater than a second index of refraction of the second dielectric layer (e.g., the first index of refraction is about 2 and the second index of refraction is about 1.44), such that a difference between the first and second indices of refraction is relatively small (e.g., less than about 0.6). Due to the difference between the first and second indices of refraction, incident light that passes from the second dielectric layer to the first dielectric layer is bent towards a line that is normal to an upper surface of the first dielectric layer, thereby directing the light towards the underlying image sensor element. However, because the difference between the first and second indices of refraction is relatively small (e.g., less than about 0.6), the incident light is not sufficiently bent towards the line. This may result in the incident light traveling to an adjacent image sensor element and/or being reflected away from the underlying image sensor element, thereby decreasing a QE of the pixel sensor, increasing cross-talk, and decreasing an overall performance of the pixel sensor.

In some embodiments, the present application is directed towards a pixel sensor having an anti-reflective coating (ARC) structure overlying an image sensor element and configured to enhance a QE of the pixel sensor. For example, the pixel sensor comprises an image sensor element disposed within a substrate. The ARC structure overlies a back-side of the substrate and comprises a first dielectric layer, a second dielectric layer, and third dielectric layer. The first dielectric layer overlies the back-side of the substrate, the second dielectric layer overlies the first dielectric layer, and the third dielectric layer overlies the second dielectric layer. The first dielectric layer comprises a first index of refraction, the second dielectric layer comprises a second index of refraction greater than the first index of refraction, and the third dielectric layer comprises a third index of refraction less than the second index of refraction (e.g., the second index of refraction is about 2.43 and the third index of refraction is about 1.44). Thus, a difference between the second and third indices of refraction is relatively large (e.g., greater than about 0.6). Due to the relatively large difference between the second and third indices of refraction, incident light that passes from the third dielectric layer to the second dielectric layer is sufficiently bent towards a line that is normal to an upper surface of the second dielectric layer, thereby sufficiently directing the incident light towards the underlying image sensor element. Thus, the incident light being directed towards an adjacent image sensor element and/or being reflected away from the underlying image sensor element is mitigated. This increases a QE of the image sensor element and decreases cross-talk, thereby increasing an overall performance of the pixel sensor.

FIG. 1 illustrates a cross-sectional view of some embodiments of a pixel sensor 100 having an anti-reflective coating (ARC) structure 118 overlying a substrate 110. In some embodiments, the circle 140 illustrates an enlarged view of a region of the pixel sensor 100 to more clearly illustrate details of the ARC structure 118.

The pixel sensor 100 includes an interconnect structure 102 disposed along a front-side 110f of the substrate 110. An image sensor element 112 is disposed within the substrate 110. The image sensor element 112 is configured to convert electromagnetic radiation 130 (e.g., photons) into electrical signals (e.g., to generate electron-hole pairs from the electromagnetic radiation 130). In some embodiments, the electromagnetic radiation 130 is back side illuminated (BSI) upon the pixel sensor 100. In some embodiments, the image sensor element 112 may, for example, be configured to generate electrical signals from near infrared (NIR) radiation (e.g., electromagnetic radiation with wavelengths in a range of about 700 nanometers (nm) to about 3,000 nm).

In some embodiments, the substrate 110 is comprised of a first material (e.g., silicon). Further, the image sensor element 112 comprises an active layer 114 that is disposed within the substrate 110. In further embodiments, the active layer 114 comprises a second material (e.g., germanium) that is different from the first material. A first isolation structure 116 is disposed within the substrate 110 and provides electrical isolation to the image sensor element 112 from other devices and/or doped regions disposed within/on the substrate 110. The first isolation structure 116 may laterally enclose the image sensor element 112. The active layer 114 may, for example, comprise photodetector regions and/or layers such as charge storage region(s), floating node(s), surface pinning regions(s), contact region(s), guard ring(s), etc. configured to convert electromagnetic radiation 130 (e.g., photons) into electrical signals and/or facilitate readout of the electrical signals. The second material of the active layer 114 is selected to ensure high QE for NIR radiation and/or infrared radiation (IR). For example, the second material (e.g., germanium) of the active layer 114 aides in absorption of IR radiation by the active layer 114, thereby increasing a QE of the image sensor element 112.

The interconnect structure 102 extends along a front-side 110f of the substrate 110 and is configured to electrically couple doped regions of the substrate 110 and/or the active layer 114 and pixel devices (e.g., transfer transistor(s), source-follower transistor(s), row-select transistor(s), etc.) to one another. The interconnect structure 102 includes an interconnect dielectric structure 104, a plurality of conductive wires 106, and a plurality of conductive vias 108. Further, the ARC structure 118 is disposed along a back-side 110b of the substrate 110. The ARC structure 118 comprises a first dielectric layer 120 with a first refractive index, a second dielectric layer 122 with a second refractive index, and a third dielectric layer 124 with a third refractive index. Further, a grid structure 126 overlies the ARC structure 118. The grid structure 126 may, for example, comprise a metal grid structure and/or a dielectric grid structure. The grid structure 126 is configured to direct the electromagnetic radiation 130 to the underlying image sensor element 112. In some embodiments, when the grid structure 126 comprises the metal grid structure (e.g., aluminum, copper, tungsten, or a combination of the foregoing), electromagnetic radiation 130 may reflect off of sidewalls of the metal grid structure to the underlying image sensor element 112 instead of traveling to an adjacent image sensor element (not shown). In such embodiments, the grid structure 126 may decrease cross-talk between adjacent image sensor elements, thereby increasing the QE of the image sensor element 112. In addition, an upper dielectric layer 128 is disposed over the grid structure 126 and the ARC structure 118.

In various embodiments, the electromagnetic radiation 130 is disposed upon the ARC structure 118 and comprises a first range of wavelengths. In some embodiments, the first dielectric layer 120 may, for example, be or comprise tantalum oxide (e.g., $Ta_2O_5$), another dielectric material, or any combination of the foregoing and/or the first index of refraction may be about 2, about 2.06, within a range of about 2 to 2.1, or another suitable value. In some embodiments, if the first range of wavelengths is within a range of about 400 nm to about 700 nm (e.g., visible light), then the first index of refraction may be within a range of about 2.11 to about 2.25, or another suitable value. In further embodiments, if the first range of wavelengths is within a range of about 700 nm to about 3,000 nm (e.g., NIR radiation), then the first index of refraction may be within a range of about 2.01 to 2.11, or another suitable value. In various embodiments, if the first range of wavelengths is within a range of about 1,400 nm to about 1,600 nm, then the first index of refraction may be within a range of about 2.056 to about 2.062, or another suitable value.

In various embodiments, the second dielectric layer 122 may, for example, be or comprise titanium oxide (e.g., $TiO_2$), silicon carbide, another suitable dielectric material, or any combination of the foregoing and/or the second index of refraction may be about 2.43, within a range of about 2.4 to 2.6, or another suitable value. In some embodiments, if the first range of wavelengths is within a range of about 400 nm to about 700 nm (e.g., visible light), then the second index of refraction may be within a range of about 2.55 to about 2.88, or another suitable value. In further embodiments, if the first range of wavelengths is within a range of about 700 nm to about 3,000 nm (e.g., NIR radiation), then the second index of refraction may be within a range of about 2.37 to 2.55, or another suitable value. In various embodiments, if the first range of wavelengths is within a range of about 1,400 nm to about 1,600 nm, then the second index of refraction may be within a range of about 2.43 to about 2.46, or another suitable value.

In some embodiments, the third dielectric layer 124 may, for example, be or comprise silicon dioxide (e.g., $SiO_2$), another oxide, high density plasma oxide, another suitable dielectric material, or any combination of the foregoing and/or the third index of refraction may be about 1.44, about 1.438, about 1.53, within a range of about 1.438 to 1.53, or another suitable value. In some embodiments, if the first range of wavelengths is within a range of about 400 nm to about 700 nm (e.g., visible light), then the third index of refraction may be within a range of about 1.46 to about 1.49, or another suitable value. In further embodiments, if the first range of wavelengths is within a range of about 700 nm to about 3,000 nm (e.g., NIR radiation), then the third index of refraction may be within a range of about 1.42 to 1.46, or another suitable value. In various embodiments, if the first range of wavelengths is within a range of about 1,400 nm to about 1,600 nm, then the third index of refraction may be within a range of about 1.443 to about 1.446, or another suitable value. In various embodiments, the second index of refraction is greater than the first index of refraction and the third index of refraction is less than the first index of refraction. This, in part, decreases reflection of electromagnetic radiation away from the image sensor element 112, thereby increasing a QE of the pixel sensor 100.

In some embodiments, the arrow 130a illustrates some non-limiting examples of a path of the electromagnetic radiation 130 as it travels through the ARC structure 118. As the electromagnetic radiation 130 traverses a boundary between the third dielectric layer 124 and the second dielectric layer 122 it is bent towards a first normal line 132. Because the third index of refraction is substantially less than the second index of refraction (i.e., a difference between the second and third indices of refraction is greater than about 0.6), a first angle of refraction $\theta_2$ is substantially less than a corresponding angle of incidence 01, thereby focusing the electromagnetic radiation 130 towards the image sensor element 112. This mitigates reflection of the electromagnetic radiation 130 away from the image sensor element 112 and/or decreases cross-talk, thereby increasing the QE of the pixel sensor 100. Further, as the electromagnetic radiation 130 traverses a boundary between the second dielectric layer 122 and the first dielectric layer 120 it is bent away from a second normal line 134. Because the first index of refraction is relatively less than the second index of refraction (i.e., a difference between the second and first indices of refraction is less than about 0.5), a second angle of refraction $\theta_3$ is slightly greater than the first angle of refraction $\theta_2$. Because the difference between the second and first indices of refraction is relatively small, reflection of the electromagnetic radiation away from the image sensor element 112 is mitigated. Finally, in some embodiments, an index of refraction of the substrate 110 is greater than the first index of refraction (e.g., the index of refraction of the substrate 110 is within a range of about 3.42 to 3.48 or another suitable value), such that as the electromagnetic radiation passes from the first dielectric layer 120 to the substrate 110 it is bent towards a line normal to the back-side 110b of the substrate 110. This directs the electromagnetic radiation 130 towards the image sensor element 112, and mitigates reflection of the electromagnetic radiation 130 away from the image sensor element 112 and/or decreases cross-talk, thereby increasing the QE of the pixel sensor 100. Thus, the ARC structure 118 is configured to increase a performance of the pixel sensor 100. In some embodiments, the first normal line 132 is normal to an upper surface of the second dielectric layer 122 (an interface between the third dielectric layer 124 and the second dielectric layer 122), the second normal line 134 is normal to an upper surface of the first dielectric layer 120 (an interface between the second dielectric layer 122 and the first dielectric layer 120), and/or the first and second normal lines 132, 134 are parallel to one another.

Figure 2A:
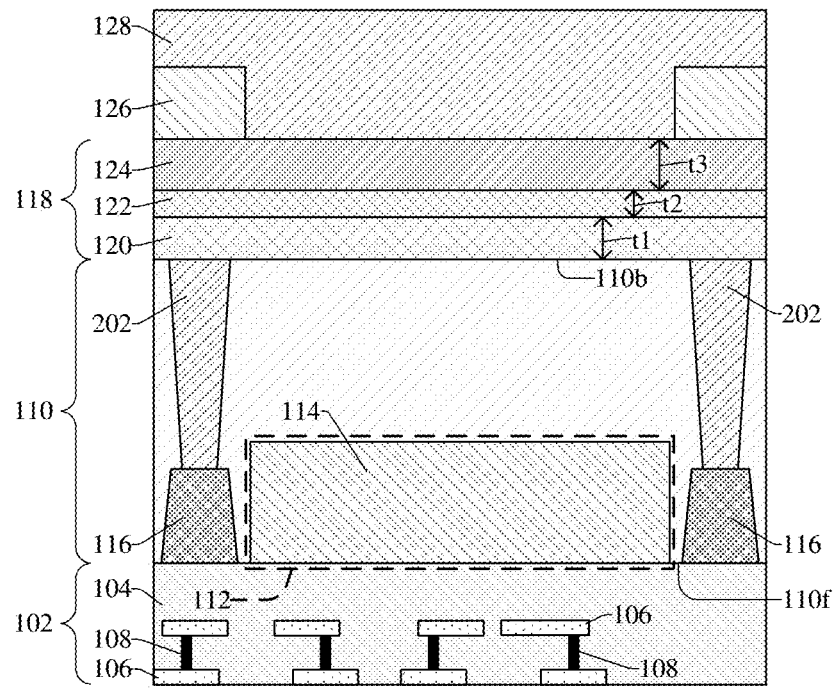
FIGS. 2A-2F illustrate cross-sectional views of some embodiments of pixel sensors according to some alternative embodiments of the pixel sensor of FIG. 1.

FIG. 2A illustrates a cross-sectional view of some embodiments of a pixel sensor 200a according to some alternative embodiments of the pixel sensor 100 of FIG. 1.

The pixel sensor 200a includes an interconnect structure 102 disposed along a front-side 110f of a substrate 110 and an ARC structure 118 disposed along a back-side 110b of the substrate 110. In some embodiments, the substrate 110 may, for example, be or comprise a bulk substrate (e.g., a bulk silicon substrate), a silicon-on-insulator (SOI) substrate, P-doped silicon, or another suitable material. Thus, the substrate 110 comprises a first material such as, for example, silicon. The interconnect structure 102 comprises an interconnect dielectric structure 104, a plurality of conductive wires 106, and a plurality of conductive vias 108. In further embodiments, the interconnect dielectric structure 104 may, for example, be or comprise a silicon dioxide, a low-k dielectric material, another suitable dielectric material, or any combination of the foregoing. In yet further embodiments, the conductive wires 106 and/or the conductive vias 108 may, for example, respectively be or comprise aluminum, copper, ruthenium, tungsten, titanium nitride, tantalum nitride, another suitable material, or any combination of the foregoing. The interconnect structure 102 is configured to electrically couple doped regions and/or semiconductor devices disposed within the pixel sensor 200a to one another.

An image sensor element 112 is disposed within the substrate 110 and comprises an active layer 114. The image sensor element 112 is, for example, configured to generate electrical signals from near infrared (NIR) radiation (e.g., electromagnetic radiation with wavelengths in a range of about 700 nanometers (nm) to about 3,000 nm). It will be appreciated that the image sensor element 112 being configured to generate electrical signals from other frequency wavelength values is also within the scope of the disclosure. A first isolation structure 116 is disposed within the substrate 110 and laterally encloses the image sensor element 112. The first isolation structure 116 extends from the front-side 110f of the substrate 110 to a point above the front-side 110f of the substrate 110. The first isolation structure 116 is configured to electrically isolate the image sensor element 112 from other devices disposed on and/or within the substrate 110. In some embodiments, the first isolation structure 116 is configured as a shallow trench isolation (STI) structure or another suitable isolation structure. In further embodiments, the first isolation structure 116 may, for example, be or comprise an oxide, such as silicon dioxide, silicon nitride, silicon carbide, silicon oxynitride, silicon oxycarbide, another suitable dielectric material, or any combination of the foregoing.

Further, a second isolation structure 202 extends from the back-side 110b of the substrate 110 to a point below the back-side 110b of the substrate 110. In some embodiments, a bottom surface of the second isolation structure 202 may contact a top surface of the first isolation structure 116. The second isolation structure 202 laterally surrounds the image sensor element 112 and is configured to electrically isolate the image sensor element 112 from other devices disposed within and/or on the substrate 110. In some embodiments, the second isolation structure 202 is configured as a deep trench isolation (DTI) structure or another suitable isolation structure. Further, in some embodiments, the second isolation structure 202 may, for example, be or comprise a dielectric material (e.g., silicon dioxide, silicon nitride, silicon carbide, another dielectric material, or any combination of the foregoing), a metal material (e.g., tungsten, copper, aluminum, another metal, or any combination of the foregoing), another suitable material, or any combination of the foregoing. In further embodiments, the second isolation structure 202 may be configured to direct incident electromagnetic radiation towards the underlying image sensor element 112. For example, when the second isolation structure 202 comprises a metal material (e.g., aluminum, copper, tungsten, etc.), electromagnetic radiation may reflect off of sidewalls of the metal material to the underlying image sensor element 112 instead of traveling to an adjacent image sensor element (not shown). In such embodiments, the second isolation structure 202 may decrease cross-talk between adjacent image sensor elements, thereby increasing a QE of the image sensor element 112.

The ARC structure 118 is disposed along the back-side 110b of the substrate 110. The ARC structure 118 includes a first dielectric layer 120 with a first index of refraction, a second dielectric layer 122 with a second index of refraction, and a third dielectric layer 124 with a third index of refraction. In some embodiments, the first dielectric layer 120 may, for example, be or comprise tantalum oxide (e.g., Ta$_2$O$_5$), another dielectric material, or any combination of the foregoing and/or the first index of refraction may be about 2, about 2.06, within a range of about 2 to 2.16, or another suitable value. In further embodiments, the second dielectric layer 122 may, for example, be or comprise titanium oxide (e.g., TiO$_2$), silicon carbide, another suitable dielectric material, or any combination of the foregoing and/or the second index of refraction may be about 2.43, within a range of about 2.4 to 2.6, or another suitable value. In yet further embodiments, the third dielectric layer 124 may, for example, be or comprise silicon dioxide (e.g., SiO$_2$), another oxide, high density plasma oxide, another suitable dielectric material, or any combination of the foregoing and/or the third index of refraction may be about 1.44, about 1.438, about 1.53, within a range of about 1.438 to 1.53, or another suitable value. In various embodiments, the second index of refraction is greater than the first index of refraction and/or the third index of refraction is less than the first index of refraction. This, in part, decreases reflection of electromagnetic radiation away from the image sensor element 112, thereby increasing a QE of the pixel sensor 200a.

The first dielectric layer 120 has a first thickness t1, the second dielectric layer 122 has a second thickness t2, and the third dielectric layer 124 has a third thickness t3. In some embodiments, the first thickness t1 is, for example, about 1,100 Angstroms, within a range of about 900 to 1,300 Angstroms, or another suitable thickness value. In further embodiments, the second thickness t2 is, for example, about 200 Angstroms, within a range of about 10 to 1,000 Angstroms, or another suitable thickness value. In yet further embodiments, the third thickness t3 is, for example, about 1,300 Angstroms, within a range of about 1,100 to 1,500 Angstroms, or another suitable thickness value. In various embodiments, the first thickness t1 is greater than the second thickness t2, and the first thickness t1 is less than the third thickness t3.

In some embodiments, the image sensor element 112 is configured to generate electrical signals from a first range of NIR radiation, where the first range of NIR radiation includes wavelengths within a range of about 1400 nm to 1600 nm, however, other values for the first range of NIR radiation are within the scope of the disclosure. In some embodiments, if the second thickness t2 is less than about 10 Angstroms, then reflectance of incident electromagnetic radiation within the first range of NIR radiation is increased, thereby decreasing a performance of the pixel sensor 200a. In yet further embodiments, if the second thickness t2 is equal to or greater than about 200 Angstroms, then reflectance of incident electromagnetic radiation within the first range of NIR radiation is decreased, thereby increasing a performance of the pixel sensor 200a. In yet further embodiments, if the first range of NIR radiation has a wavelength of about 1550 nm and the second thickness t2 is approximately 200 Angstroms, then reflectance of incident electromagnetic radiation within the first range of NIR radiation may be reduced from about 15% to about 6.2%. In such embodiments, the reflectance of incident electromagnetic radiation within the first range of NIR radiation being about 15% corresponds to an embodiment in which the second dielectric layer 122 is omitted (e.g., the second thickness t2 is 0 Angstroms) (not shown). Thus, the second dielectric layer 122 increases an overall performance of the pixel sensor 200a.

In addition, a grid structure 126 overlies the ARC structure 118. The grid structure 126 may, for example, comprise a metal grid structure and/or a dielectric grid structure. Further, an upper dielectric layer 128 is disposed over the grid structure 126 and the ARC structure 118. In some embodiments, the upper dielectric layer 128 may, for example, be or comprise an oxide such as silicon dioxide, another suitable dielectric material, or any combination of the foregoing. In yet further embodiments, the upper dielectric layer 128 comprises a same material as the third dielectric layer 124.

Figure 2B:
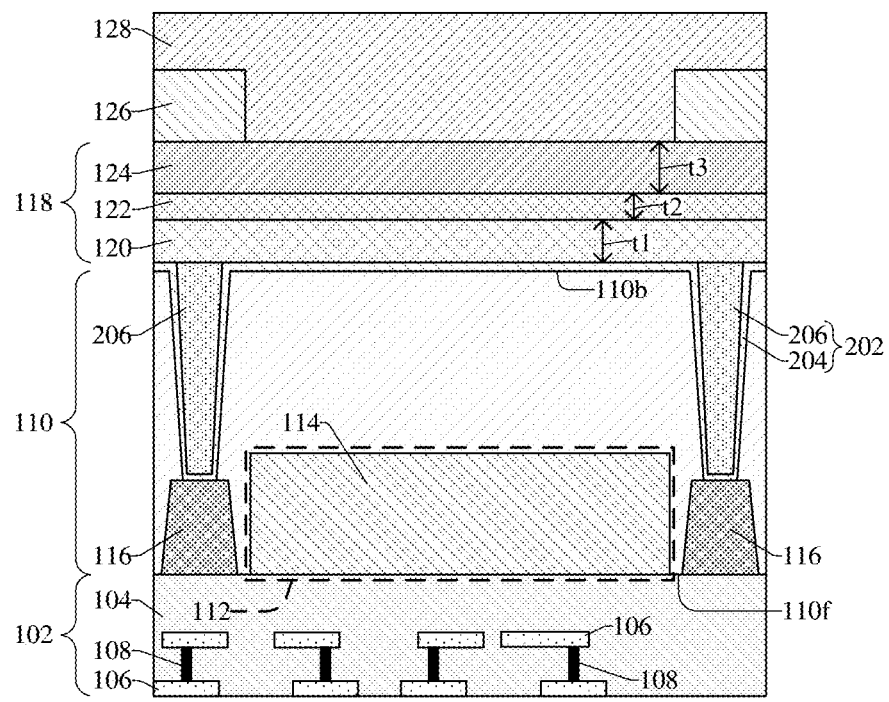

FIG. 2B illustrates a cross-sectional view of some embodiments of a pixel sensor 200b according to some alternative embodiments of the pixel sensor 200a of FIG. 2A.

In some embodiments, the second isolation structure 202 comprises a passivation layer 204 and a conductive trench layer 206. The passivation layer 204 may, for example, be or comprise a dielectric material, such as silicon dioxide, silicon oxynitride, silicon oxycarbide, another suitable dielectric material, or any combination of the foregoing. Further, the passivation layer may continuously extend along the back-side 110b of the substrate 110. The passivation layer 204 is disposed between the conductive trench layer 206 and the substrate 110, thereby electrically isolating the conductive trench layer 206 from the substrate 110. In further embodiments, the conductive trench layer 206 may, for example, be or comprise aluminum, tungsten, copper, another suitable conductive material, or any combination of the foregoing. Further, the conductive trench layer 206 may be configured to decrease cross-talk between adjacent image sensor elements disposed within the substrate 110. This, in part, further increases a performance of the pixel sensor 200b. In further embodiments, a thickness of the passivation layer 204 may be less than the first, second, and/or third thicknesses t1, t2, t3. In yet further embodiments, an index of refraction of the passivation layer 204 may be equal to the third index of refraction of third dielectric layer 124. In various embodiments, the index of refraction of the passivation layer 204 may be less than the first index of refraction of the first dielectric layer 120 and/or may be less than the second index of refraction of the second dielectric layer 122.

Figure 2C:
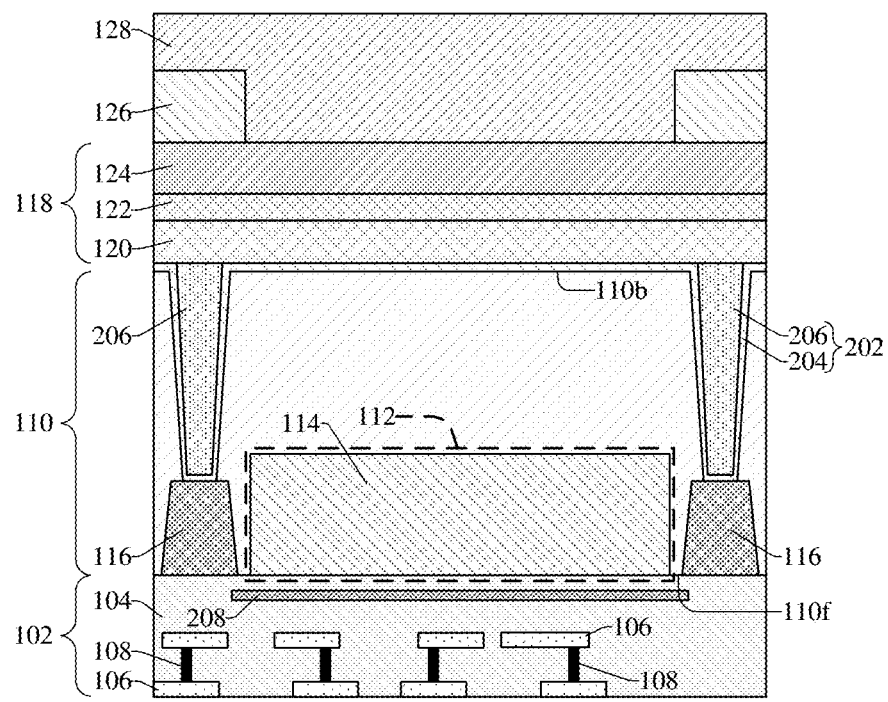

FIG. 2C illustrates a cross-sectional view of some embodiments of a pixel sensor 200c according to some alternative embodiments of the pixel sensor 200a of FIG. 2A.

A reflector 208 underlies the image sensor element 112 and is separated from the front-side 110f of the substrate by the interconnect dielectric structure 104. In some embodiments, the reflector 208 comprises of a metal material (e.g., aluminum, tungsten, copper, another metal material, or any combination of the foregoing). The reflector 208 is configured to reflect incident electromagnetic radiation disposed on the back-side 110b of the substrate 110 that passes through the front-side 102f of the substrate 110 back to the image sensor element 112. This, in part, further increases the QE of the image sensor element 112, thereby increasing the performance of the pixel sensor 200c. In yet further embodiments, the reflector 208 may be comprised of a first metal material that is different than a second metal material the conductive wires 106 are comprised of.

Figure 2D:
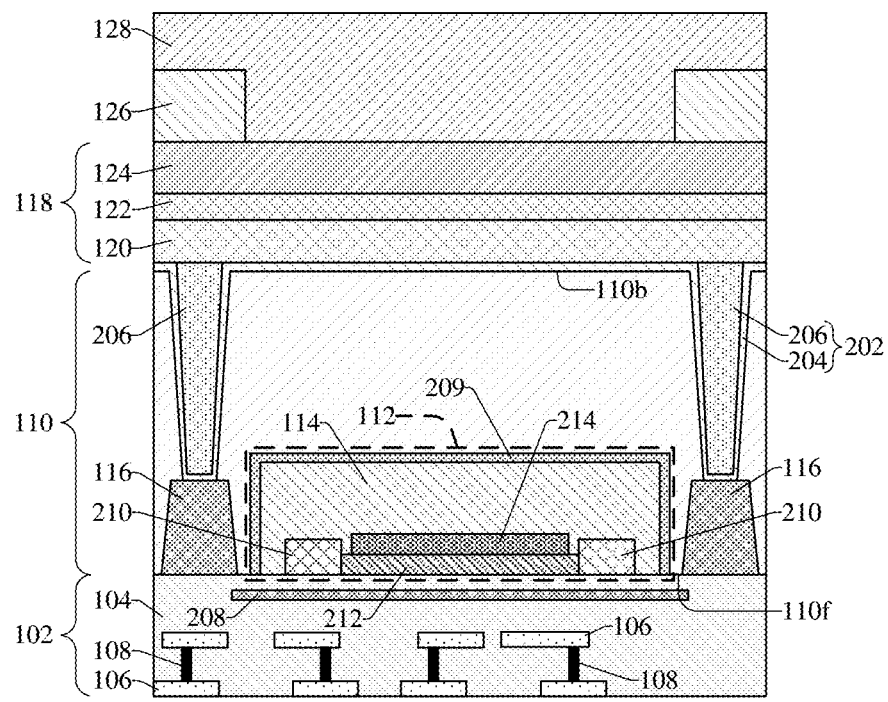

FIG. 2D illustrates a cross-sectional view of some embodiments of a pixel sensor 200d according to some alternative embodiments of the pixel sensor 200a of FIG. 2A.

The substrate 110 may be, for example, a bulk substrate (e.g., a bulk silicon substrate), a silicon-on-insulator (SOI) substrate, P doped silicon, N doped silicon, or another suitable material. In some embodiments, the substrate 110 is lightly doped with dopants of a first conductivity type (e.g., P-type). In various embodiments, the image sensor element 112 is configured as a single photon avalanche diode (SPAD) which can detect incident radiation with very low intensities (e.g., a single photon). In further embodiments, the image sensor element 112 may, for example, be used in a near IR (NIR) direct-time of flight (D-TOF) application. In some embodiments, the active layer 114 comprises the second material (e.g., germanium) that is lightly doped with dopants of the first conductivity type. The active layer 114 may comprise a first deep well 214 of the first conductivity type and a first heavily doped region 212 of a second conductivity type (e.g., N-type) opposite to the first conductivity type. The first deep well 214 is disposed above the first heavily doped region 212. A multiplication junction region is formed at an interface between the first heavily doped region 212 and the first deep well 214. In some embodiments, the first deep well 214 is vertically spaced from the first heavily doped region 212 (not shown) such that the multiplication junction region is formed at an interface between the first heavily doped region 212 and the active layer 114.

In some embodiments, the image sensor element 112 further comprises a second deep well 210 heavily doped with dopants of the first conductivity type. The second deep well 210 extends from the front-side 110f of the substrate to a point above the first heavily doped region 212. In some embodiments, the second deep well 210 is configured as a guard ring to prevent premature edge break down of the image sensor element 112 in the SPAD configuration. Further, a buffer layer 209 is disposed between the active layer 114 and the substrate 110. The buffer layer 209 may comprise the same dopants and doping concentration as the active layer 114. In some embodiments, the buffer layer 209 is omitted such that the active layer 114 directly contacts the substrate 110 (not shown). In some embodiments, dopants of the first conductivity type are P-type (e.g., boron, some other suitable P-type dopants, or any combination of the foregoing) and dopants of the second conductivity type are N-type (e.g., arsenic, phosphorus, some other suitable N-type dopants, or any combination of the foregoing), or vice versa.

In some embodiments, during operation in the SPAD configuration, the image sensor element 112 is reverse biased above its breakdown voltage, and incident photons (e.g., wavelengths within the range of near infrared (NIR) radiation) strike the image sensor element 112 to generate charge carriers. The photon-generated charge carries move to the multiplication junction region and trigger an avalanche current that amplifies the signals generated by the photons so that they are easier to detect. In some embodiments, a doping type and/or concentration of the first deep well 214 can be configured to adjust the breakdown voltage of the image sensor element 112 in the SPAD configuration. In yet further embodiments, conductive features (e.g., conductive vias 108 and/or conductive wires 106) within the interconnect structure 102 are electrically coupled to doped regions within the active layer 114 to facilitate readout of signals generated by the photons.

The second material (e.g., germanium) of the active layer 114 is selected such that the image sensor element 112 has high sensitivity to electromagnetic radiation having wavelengths within the range of NIR radiation. This increases a quantum efficiency (QE) of the image sensor element 112 when receiving wavelengths within the range of NIR radiation. However, as the wavelength of the incident electromagnetic radiation increases, the QE of the image sensor element 112 may decrease. For example, if the wavelength of incident electromagnetic radiation is about 940 nm, 1310 nm, and/or 1550 nm, then the QE of the image sensor element 112 may be about 86%, 50%, and/or 32%, respectively. Further, in some embodiments, in order to mitigate damage to the human eye, the wavelength of incident electromagnetic radiation transmitted by an NIR light source for a D-TOF application may be limited to wavelengths within a first range including about 1400 nm to about 2600 nm. Thus, the ARC structure 118 is configured to decrease reflection away from the image sensor 112 when receiving wavelengths within the first range of wavelengths, thereby mitigating an effect of the lower QE of the image sensor element 112 and increasing an overall performance of the pixel sensor 200d in D-TOF applications.

Figure 2E:
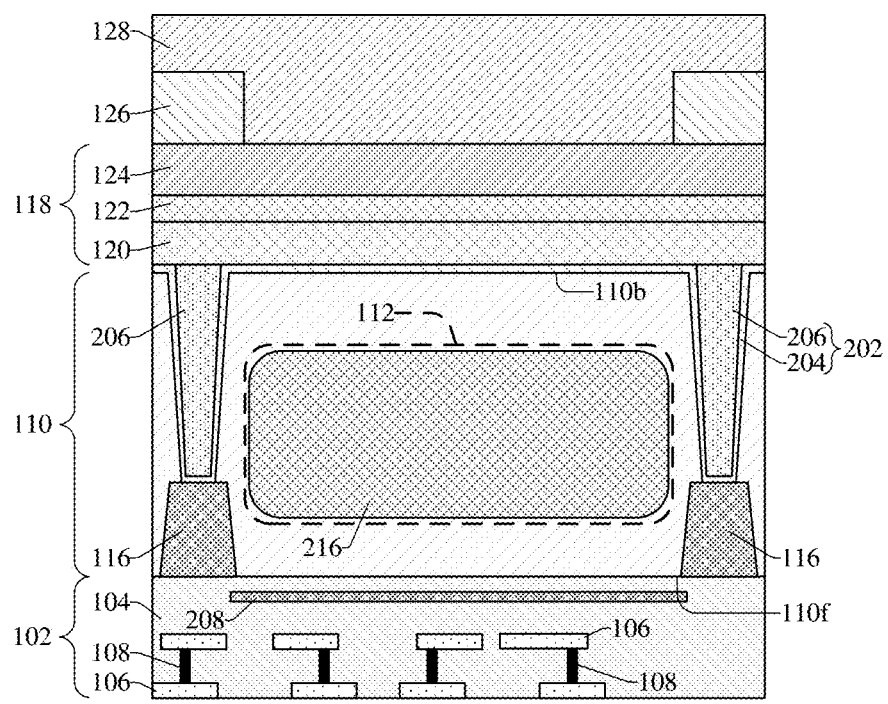

FIG. 2E illustrates a cross-sectional view of some embodiments of a pixel sensor 200e according to some alternative embodiments of the pixel sensor 200a of FIG. 2A.

In some embodiments, the image sensor element 112 comprises a doped region 216 of the substrate 110. In various embodiments, regions of the substrate 110 adjacent to and/or contacting the doped region 216 comprise a first doping type (e.g., p-type dopants) and the doped region 216 comprises a second doping type (e.g., n-type) different from the first doping type. In some embodiments, the first doping type is p-type and the second doping type is n-type, or vice versa. The image sensor element 112 is configured to generate electrical signals from electromagnetic radiation within a range of frequencies. In some embodiments, the range of frequencies may, for example, include visible light (e.g., electromagnetic radiation with wavelengths in a range of about 400 nm to about 700 nm). It will be appreciated that the image sensor element 112 being configured to generate electrical signals from other frequency wavelength values is also within the scope of the disclosure.

Figure 2F:
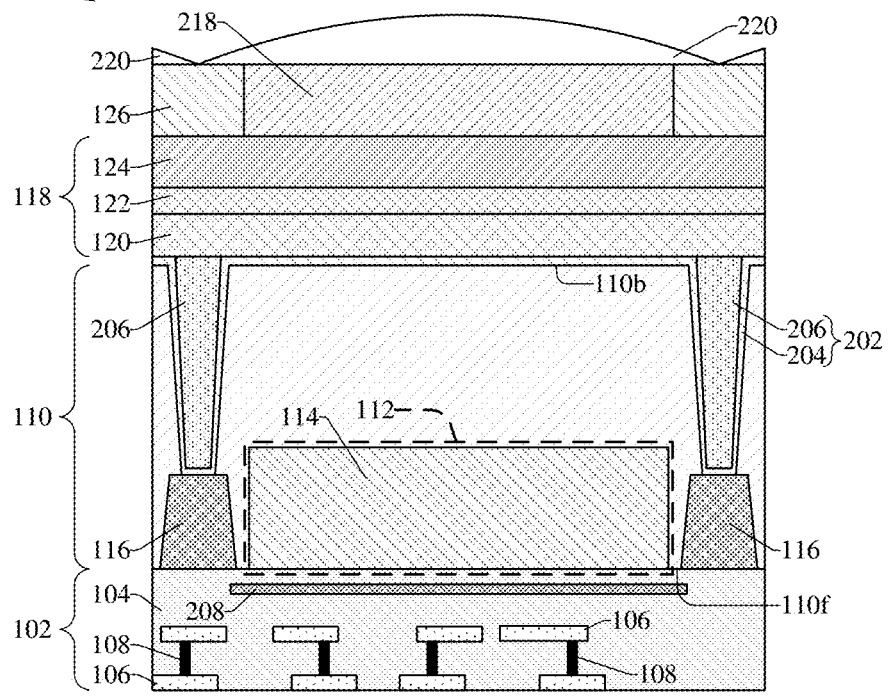

FIG. 2F illustrates a cross-sectional view of some embodiments of a pixel sensor 200f according to some alternative embodiments of the pixel sensor 200a of FIG. 2A.

A light filter 218 (e.g., a color filter, an infrared (IR) filter, etc.) overlies the ARC structure 118 and is disposed laterally between sidewalls of the grid structure 126. The light filter 218 is configured to transmit specific wavelengths of incident radiation. For example, the light filter 218 may transmit radiation having wavelengths within a first range while blocking radiation having wavelengths within a second range that is different from the first range. Further, a plurality of micro-lenses 220 is disposed over the light filter 218 and the grid structure 126. The micro-lenses 220 are configured to focus incident electromagnetic radiation towards the substrate 110, thereby increasing the QE of the image sensor element 112. In yet further embodiments, the image sensor element 112 may be configured as the image sensor element 112 of the pixel sensor 200e of FIG. 2E.

Figure 3:
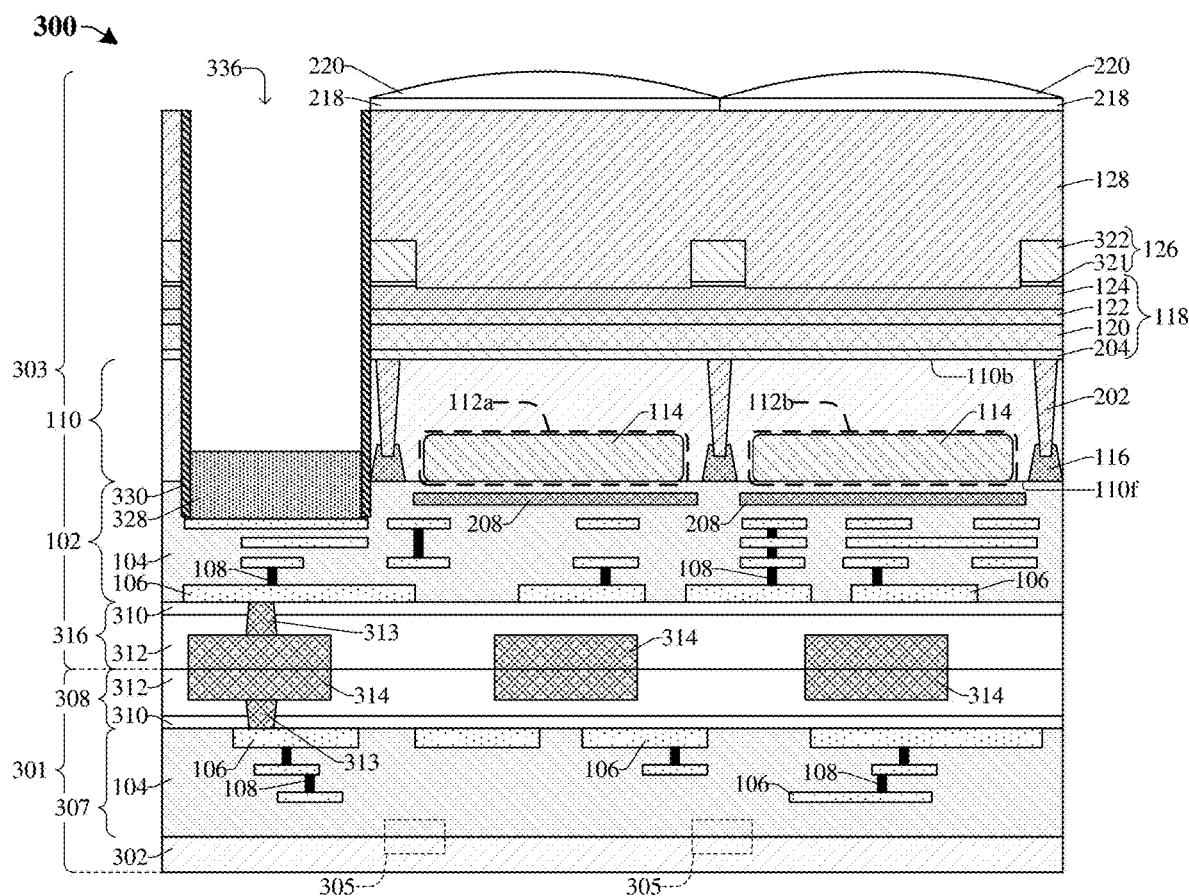
FIG. 3 illustrates a cross-sectional view of some embodiments of an integrated circuit (IC) comprising a first IC die underlying a second IC die, where the second IC die includes an ARC structure overlying a plurality of image sensor elements.

FIG. 3 illustrates a cross-sectional view of some embodiments of an integrated circuit (IC) 300 comprising a first IC die 301 underlying a second IC die 303, where the second IC die 303 includes an ARC structure 118 overlying a plurality of image sensor elements 112a-b.

As illustrated in FIG. 3, the first IC die 301 includes a lower interconnect structure 307 overlying a lower substrate 302. The lower substrate 302 may, for example, be a bulk substrate (e.g., a bulk silicon substrate), a silicon-on-insulator (SOI) substrate, P dope silicon, N doped silicon, another suitable material, or any combination of the foregoing. The lower interconnect structure 307 includes the interconnect dielectric structure 104, the plurality of conductive wires 106, and the plurality of conductive vias 108. The lower interconnect structure 307 is configured to electrically couple semiconductor devices 305 disposed on and/or within the lower substrate 302 to each other, other devices (e.g., the image sensor elements 112a-b), and/or doped regions disposed within the lower substrate 302. In some embodiments, the semiconductor devices 305 may be configured as transistors, pixel devices (e.g., source-follower transistors, row-select transistors, reset transistors, etc.), capacitors, other semiconductor devices, or any combination of the foregoing. In yet further embodiments, the first IC die 301 is configured as an application-specific integrated circuit (ASIC), where the semiconductor devices 305 are configured as ASIC devices The first and second IC dies 301, 303 meet at a bond interface between a first bond structure 308 and a second bond structure 316. The first and second bond structures 308, 316 each include a bond dielectric structure 312, bond etch stop layer 310, redistribution vias 313, and redistribution wires 314. The first and second bond structures 308, 316 are configured to facilitate bonding the second IC die 303 to the first IC die 301 and electrically coupling the interconnect structure 102 to the lower interconnect structure 307. This, in part, facilitates the image sensor elements 112a-b being electrically coupled to the semiconductor devices 305 by way of the interconnect structure 102 and the lower interconnect structure 307.

Further, the second IC die 303 includes a plurality of image sensor elements 112a-b disposed within the substrate 110 and laterally offset from an upper bond pad structure 328. In some embodiments, each of the image sensor elements 112a-b comprise the active layer 114 and may be configured as the image sensor element 112 of FIG. 1, 2A-2D, or 2F. In yet further embodiments, each of the image sensor elements 112a-b may be configured as the image sensor element 112 of FIG. 2E, such that each image sensor element 112a-b comprises the doped region (216 of FIG. 2E). The ARC structure 118 overlies the back-side 110a-b of the substrate 110 and is configured to increase a QE of the image sensor elements 112a-b. In some embodiments, the ARC structure 118 includes the passivation layer 204 disposed between the back-side 110b of the substrate 110 and the first dielectric layer 120. In yet further embodiments, the passivation layer 204 is disposed between the substrate 110 and the second isolation structure 202 (not shown) (e.g., see FIG. 2B).

The grid structure 126 overlies the ARC structure 118. In some embodiments, the grid structure 126 may include a first grid layer 321 and a second grid layer 322 overlying the first grid layer 321. The first and second grid layers 321, 322 may, for example, each be or comprise a conductive material, such as tungsten, aluminum, copper, a combination of the foregoing, or the like. In further embodiments, the first and second grid layers 321, 322 may be or comprise a conductive material or a dielectric material. For example, the first grid layer 321 may be or comprise a conductive grid structure (e.g., comprising tungsten, aluminum, copper, another conductive material, etc.) configured to direct incident radiation towards the image sensor elements 112a-b and the second grid layer 322 may be or comprise a dielectric grid structure configured to achieve total internal reflection (TIR) with the upper dielectric layer 128, or vice versa. This may increase a QE of the image sensor elements 112a-b. A plurality of light filters 218 overlies the grid structure 126 and a plurality of micro-lenses overlies the plurality of light filters 218. An upper etch stop layer 330 lines an opening 336 that exposes an upper surface of the upper bond pad structure 328. In some embodiments, the upper etch stop layer 330 may, for example, be or comprise silicon nitride, silicon carbide, silicon oxynitride, silicon oxycarbide, another suitable dielectric material, or any combination of the foregoing. In some embodiments, a bond pad (not shown) is disposed within the opening 336 and overlies the upper bond pad structure 328. The bond pad is configured to electrically couple the first and/or second IC dies 301, 303 to another integrated circuit (not shown).

FIGS. 4-11 illustrate cross-sectional views 400-1100 of some embodiments of a method of forming a pixel sensor having an anti-reflective coating (ARC) structure overlying an image sensor element according to the present disclosure. Although the cross-sectional views 400-1100 shown in FIGS. 4-11 are described with reference to a method, it will be appreciated that the structures shown in FIGS. 4-11 are not limited to the method but rather may stand alone separate of the method. Furthermore, although FIGS. 4-11 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 4:
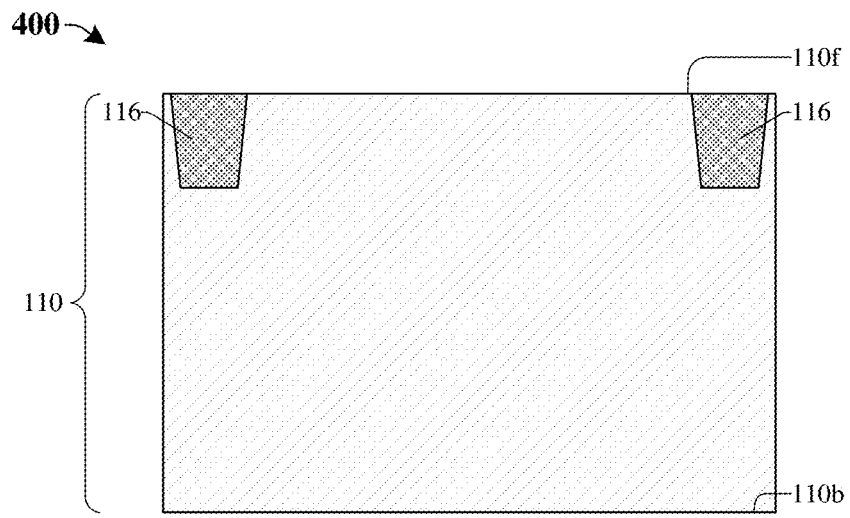
FIGS. 4-11 illustrate cross-sectional views of some embodiments of a method of forming a pixel sensor having an ARC structure overlying an image sensor element.

As illustrated in the cross-sectional view 400 of FIG. 4, a substrate 110 is provided and a first isolation structure 116 is formed within the substrate 110. In some embodiments, the substrate 110 may, for example, be a bulk substrate (e.g., a bulk silicon substrate), a silicon-on-insulator (SOI) substrate, or some other suitable substrate. In further embodiments, the first isolation structure 116 may be formed by selectively etching the substrate 110 to form a trench in the substrate 110, and subsequently filing (e.g., by chemical vapor deposition (CVD), physical vapor deposition (PVD), atomic layer deposition (ALD), or another suitable deposition or growth process) the trench with a dielectric material. In yet further embodiments, the substrate 110 is selectively etched by forming a masking layer (not shown) over a front-side 110f of the substrate 110, and subsequently exposing the substrate 110 to one or more etchants configured to selectively remove unmasked portions of the substrate 110.

In various embodiments, the dielectric material may, for example, be or comprise an oxide (e.g., silicon dioxide), a nitride (e.g., silicon nitride), a carbide (e.g., silicon carbide), another suitable dielectric material, or any combination of the foregoing.

Figure 5:
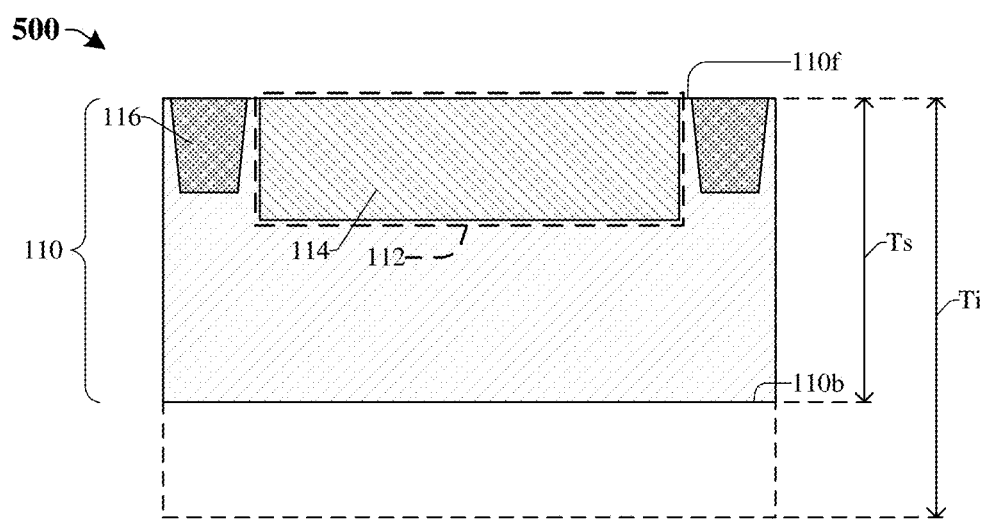

As illustrated in the cross-sectional view 500 of FIG. 5, an image sensor element 112 is formed within the substrate 110. In some embodiments, a process for forming the image sensor element 112 includes: selectively etching the substrate 110 to define an opening that extends into the front-side 110f of the substrate 110; depositing an active material (e.g., germanium) within the opening; and performing a planarization process (e.g., a chemical mechanical planarization (CMP) process) into the active material, thereby forming an active layer 114 within the substrate 110. In further embodiments, a buffer layer (not shown) is selectively grown within the opening before forming the active layer 114, such that the buffer layer is disposed between the active layer 114 and the substrate 110 (e.g., see the buffer layer 209 of FIG. 2D). In yet further embodiments, the buffer layer and/or the active material may, for example, respectively be formed by molecular-beam epitaxy (MBE), vapor phase epitaxy (VPE), liquid-phase epitaxy (LPE), some other suitable epitaxial process, some other suitable deposition or growth process, or any combination of the foregoing. In addition, one or more forming processes (e.g., including selective ion implantation processes, or other suitable processing steps) may be performed to define well region(s), doped region(s), or other suitable regions and/or structures within the active layer 114. For example, the one or more forming processes may be performed to form the second deep well 210, the first heavily doped region 212, and/or the first deep well 214 of FIG. 2D in the active layer 114.

In yet alternative embodiments, a process for forming the image sensor element 112 may include performing a selective ion implantation process into the substrate 110 to form a doped region (not shown) (e.g., see the doped region 216 of FIG. 2E) within the substrate 110. The doped region may be disposed laterally between sidewalls of the first isolation structure 116. In such embodiments, the substrate 110 comprises a first doping type (e.g., p-type) laterally adjacent to the doped region, where the doped region comprises a second doping type (e.g., n-type) opposite to the first doping type. In such embodiments, the active layer 114 is omitted and the image sensor element 112 is configured as the image sensor element 112 of FIG. 2E.

In addition, as illustrated in the cross-sectional view 500 of FIG. 5, after forming the image sensor element 112, a thinning process is performed on the back-side 110b of the substrate 110 to reduce an initial thickness Ti of the substrate 110 to a thickness Ts. The thickness Ts is defined between the front-side 110f of the substrate 110 and the back-side 110 of the substrate 110. In some embodiments, the thinning process may include performing a mechanical grinding process, a CMP process, another suitable thinning process, or any combination of the foregoing.

Figure 6:
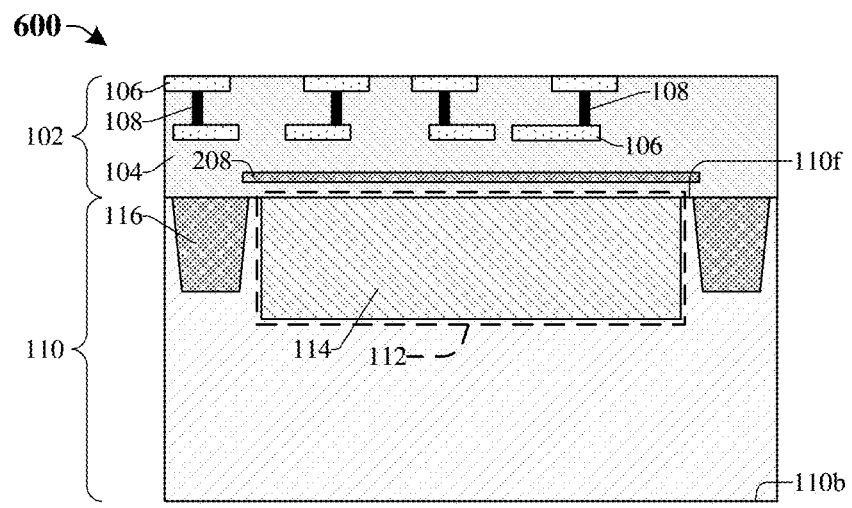

As illustrated in the cross-sectional view 600 of FIG. 6, an interconnect structure 102 is formed over the front-side 110f of the substrate 110. The interconnect structure 102 includes an interconnect dielectric structure 104, a plurality of conductive wires 106, a plurality of conductive vias 108, and a reflector 208. In some embodiments, the interconnect dielectric structure 104 may, for example, be or comprise an oxide (e.g., silicon dioxide), a nitride (e.g., silicon nitride), a low-k dielectric material, another suitable dielectric material, or any combination of the foregoing. The interconnect dielectric structure 104 may be formed by one or more deposition processes (e.g., CVD, PVD, ALD, or another suitable deposition or growth process). The plurality of conductive wires 106 and/or the plurality of conductive vias 108 may, for example, be formed by a single damascene process, a dual damascene process, or another suitable formation process. Further, the reflector 208 may be formed concurrently with at least one layer of the conductive wires 106 and/or the conductive vias 108. In some embodiments, the conductive wires 106 and/or the conductive vias 108 may, for example, respectively be or comprise aluminum, copper, titanium nitride, tantalum nitride, ruthenium, another suitable conductive material, or any combination of the foregoing. In yet further embodiments, the reflector 208 may, for example, be or comprise aluminum, tungsten, copper, another metal material, or any combination of the foregoing.

Figure 7:
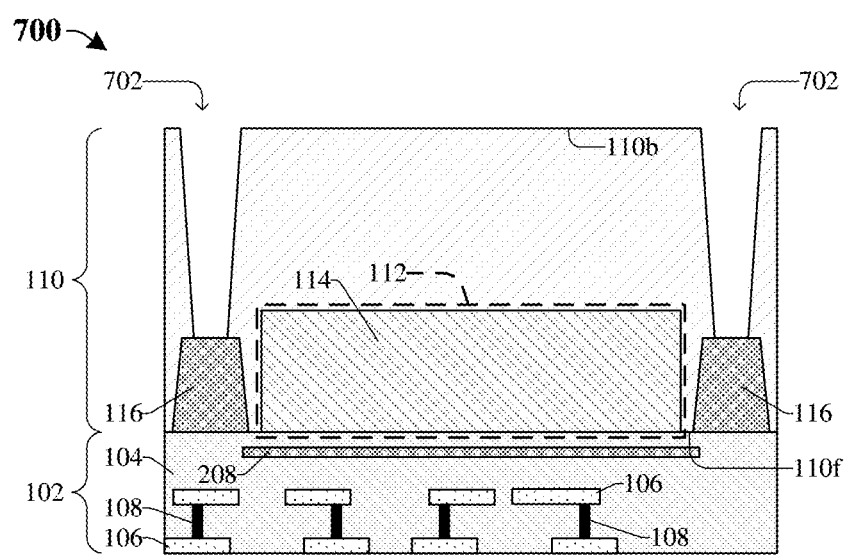

As illustrated by the cross-sectional view 700 of FIG. 7, the structure of FIG. 6 is flipped and a patterning process is performed into the back-side 110b of the substrate 110, thereby forming a deep trench isolation (DTI) opening 702. In some embodiments, the patterning process includes: forming a masking layer (not shown) over the back-side 110b of the substrate 110; exposing unmasked regions of the substrate 110 to one or more etchants, thereby forming the DTI opening 702; and performing a removal process to remove the masking layer.

Figure 8:
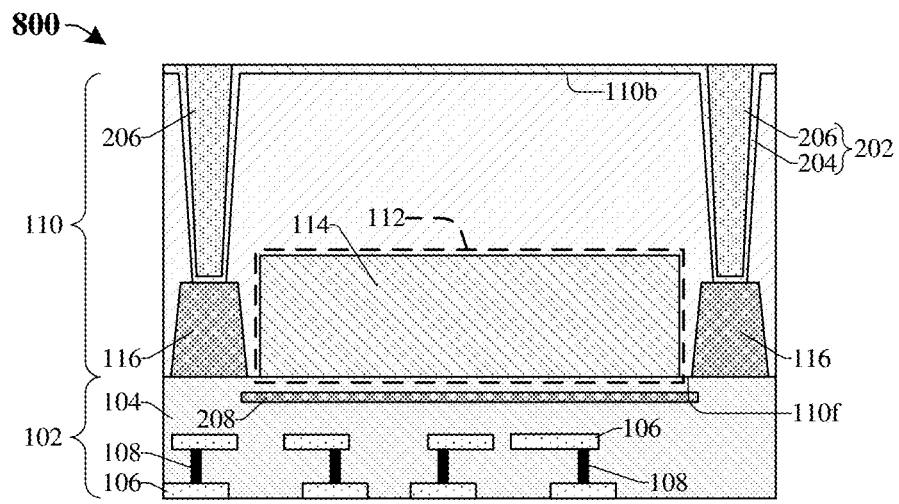

As illustrated by the cross-sectional view 800 of FIG. 8, a second isolation structure 202 is formed over the back-side 110b of the substrate 110, thereby filling the DTI opening (702 of FIG. 7). In various embodiments, the second isolation structure 202 may be configured as a DTI structure and/or may include a passivation layer 204 and a conductive trench layer 206. In some embodiments, a process for forming the second isolation structure 202 includes: depositing (e.g., by CVD, PVD, ALD, or another suitable deposition or growth process) a passivation layer 204 over the substrate 110, where the passivation layer 204 overlies the back-side 110b of the substrate 110 and lines the DTI opening (702 of FIG. 7); depositing (e.g., by CVD, PVD, electroless plating, sputtering, electro plating, or another suitable deposition or growth process) a conductive material over the back-side 110b of the substrate 110, where the conductive material overlies the substrate 110 and fills the DTI opening (702 of FIG. 7); and performing a planarization process (e.g., a CMP process) into the conductive material and/or the passivation layer 204, thereby forming the conductive trench layer 206 and the second isolation structure 202. In some embodiments, the passivation layer 204 may, for example, be or comprise a dielectric material, such as silicon dioxide, silicon oxynitride, silicon oxycarbide, another suitable dielectric material, or any combination of the foregoing. In further embodiments, the conductive trench layer 206 may, for example, be or comprise aluminum, tungsten, copper, another suitable conductive material, or any combination of the foregoing.

Figure 9:
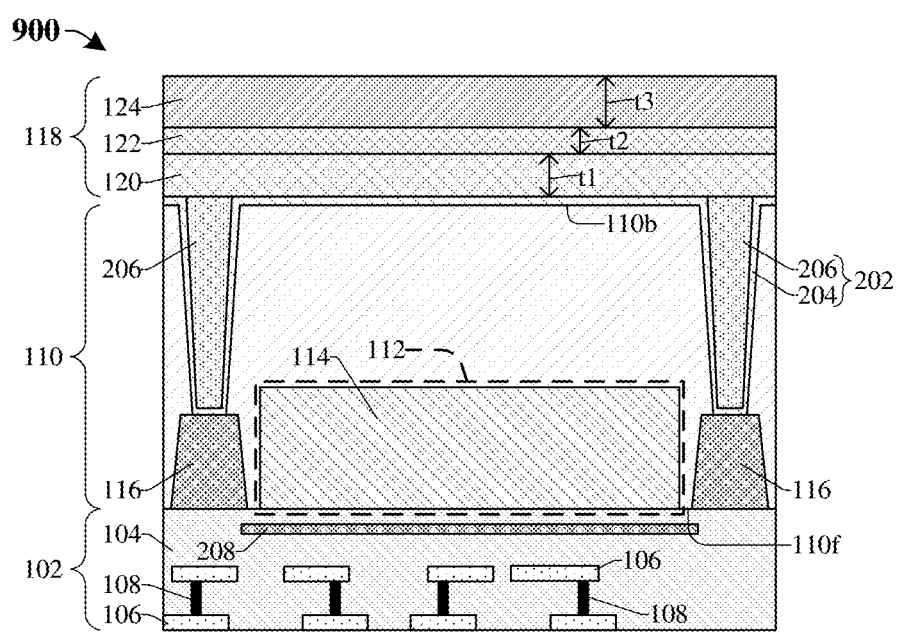

As illustrated by the cross-sectional view 900 of FIG. 9, an anti-reflective coating (ARC) structure 118 is formed over the back-side 110b of the substrate 110. In some embodiments, the ARC structure 118 includes a first dielectric layer 120, a second dielectric layer 122, and a third dielectric layer 124. In further embodiments, a process for forming the ARC structure 118 includes: depositing (e.g., by CVD, PVD, ALD, or another suitable deposition or growth process) the first dielectric layer 120 over the substrate 110; depositing (e.g., by CVD, PVD, ALD, or another suitable deposition or growth process) the second dielectric layer 122 over the first dielectric layer 120; and depositing (e.g., by CVD, PVD, ALD, or another suitable deposition or growth process) the third dielectric layer 124 over the second dielectric layer 122, thereby forming the ARC structure 118. In some embodiments, the third dielectric layer 124 is formed by a plasma-enhanced CVD process, an ALD process, high-density plasma CVD, or another suitable growth or deposition process.

The first dielectric layer 120 has a first index of refraction, the second dielectric layer 122 has a second index of refraction, and the third dielectric layer 124 has a third index of refraction. In some embodiments, the first dielectric layer 120 may, for example, be or comprise tantalum oxide (e.g., $Ta_2O_5$), another dielectric material, or any combination of the foregoing and/or the first index of refraction may be about 2, about 2.06, within a range of about 2 to 2.16, or another suitable value. In further embodiments, the second dielectric layer 122 may, for example, be or comprise titanium oxide (e.g., $TiO_2$), silicon carbide, another suitable dielectric material, or any combination of the foregoing and/or the second index of refraction may be about 2.43, within a range of about 2.4 to 2.6, or another suitable value. In yet further embodiments, the third dielectric layer 124 may, for example, be or comprise silicon dioxide (e.g., $SiO_2$), another oxide, high density plasma oxide, another suitable dielectric material, or any combination of the foregoing and/or the third index of refraction may be about 1.44, about 1.438, about 1.53, within a range of about 1.438 to 1.53, or another suitable value. In various embodiments, the second index of refraction is greater than the first index of refraction and/or the third index of refraction is less than the first index of refraction. This, in part, decreases reflection of electromagnetic radiation away from the image sensor element 112, thereby increasing a QE of the image sensor element 112.

In some embodiments, the first dielectric layer 120 is formed to a first thickness t1 that is, for example, about 1,100 Angstroms, within a range of about 900 to 1,300 Angstroms, or another suitable thickness value. In further embodiments, the second dielectric layer 122 is formed to a second thickness t2 that is, for example, about 200 Angstroms, within a range of about 10 to 1,000 Angstroms, or another suitable thickness value. In yet further embodiments, the third dielectric layer 124 is formed to a third thickness t3 that is, for example, about 1,300 Angstroms, within a range of about 1,100 to 1,500 Angstroms, or another suitable thickness value. In various embodiments, the first thickness t1 is greater than the second thickness t2, and the first thickness t1 is less than the third thickness t3.

Figure 10:
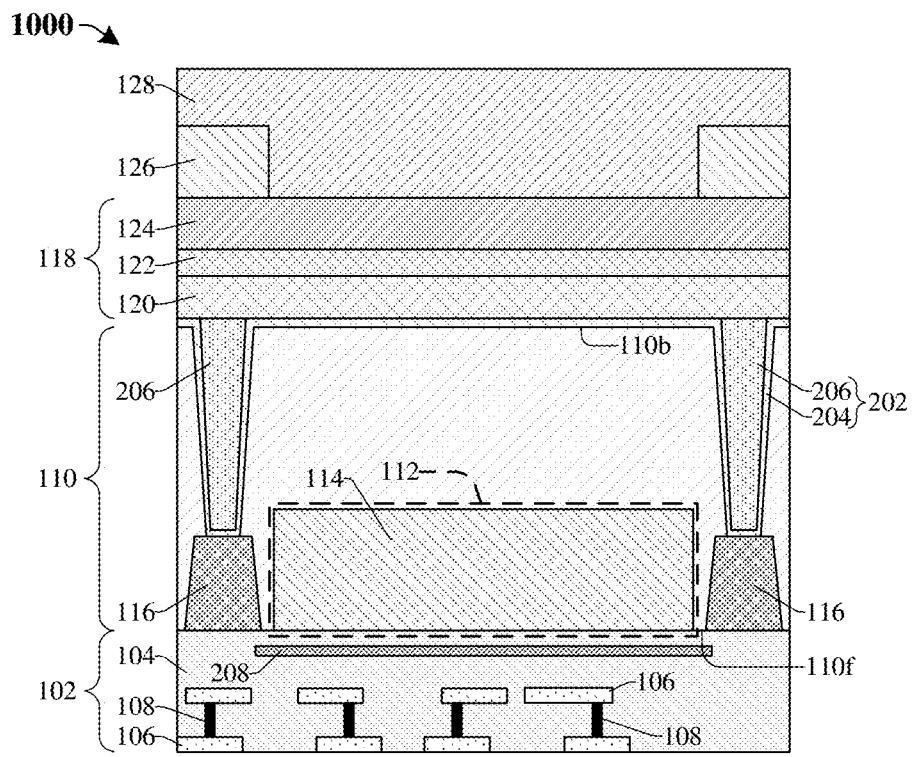

As illustrated by the cross-sectional view 1000 of FIG. 10, a grid structure 126 and an upper dielectric layer 128 are formed over the ARC structure 118. In some embodiments, the grid structure 126 may comprise a metal grid structure and/or a dielectric grid structure. In further embodiments, the metal grid structure and/or the dielectric grid structure may be formed by, for example, CVD, PVD, ALD, sputtering, electroless plating, electro plating, or another suitable growth or deposition process. Further, after depositing the metal grid structure and/or the dielectric grid structure, a patterning process may be performed on the metal grid structure and/or the dielectric grid structure to define an opening. Subsequently, the upper dielectric layer 128 may be formed within the opening and over the ARC structure 118.

Figure 11:
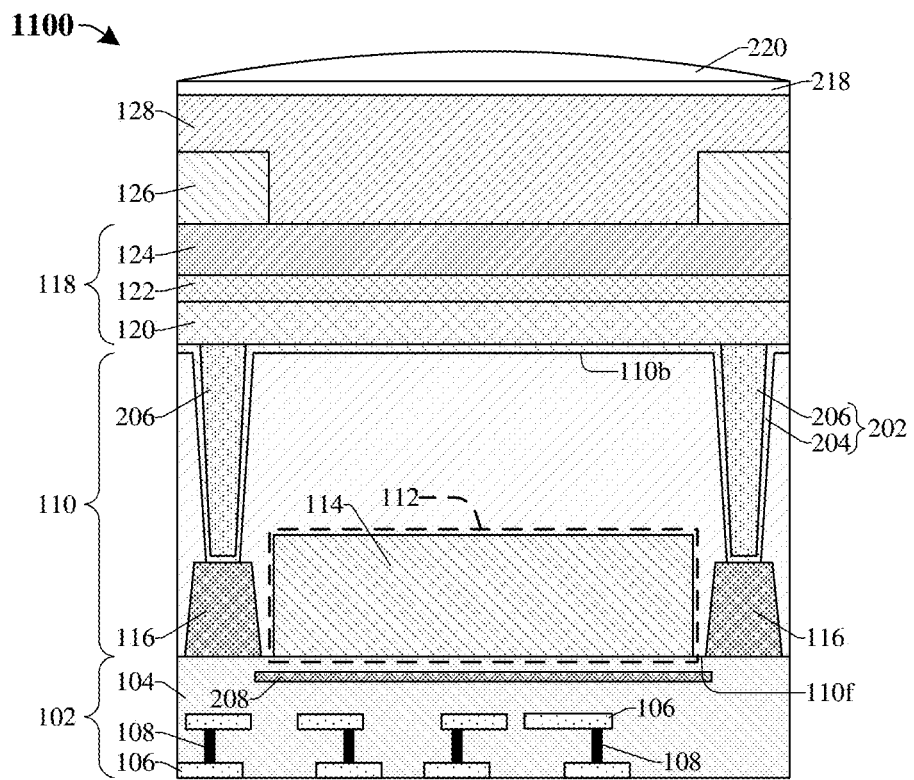

As illustrated by the cross-sectional view 1100 of FIG. 11, a light filter 218 is formed over the upper dielectric layer 128 and a micro-lens 220 is formed over the light filter 218. The light filter 218 is formed of material that allows for the transmission of incident electromagnetic radiation (e.g., light) having a specific wavelength range, while blocking incident wavelength with another wavelength outside of the specified range. In further embodiments, the light filter 218 may be formed by CVD, PVD, ALD, sputtering, or the like and/or may be planarized (e.g., via a chemical mechanical planarization (CMP) process) subsequent to formation. Further, in some embodiments, the micro-lens 220 may be formed by depositing (e.g., by CVD, PVD, etc.) a lens material on the light filter 218. A lens template (not shown) having a curved upper surface is patterned above the lens material. The micro-lens 220 is then formed by selectively etching the lens material according to the lens template.

Figure 12:
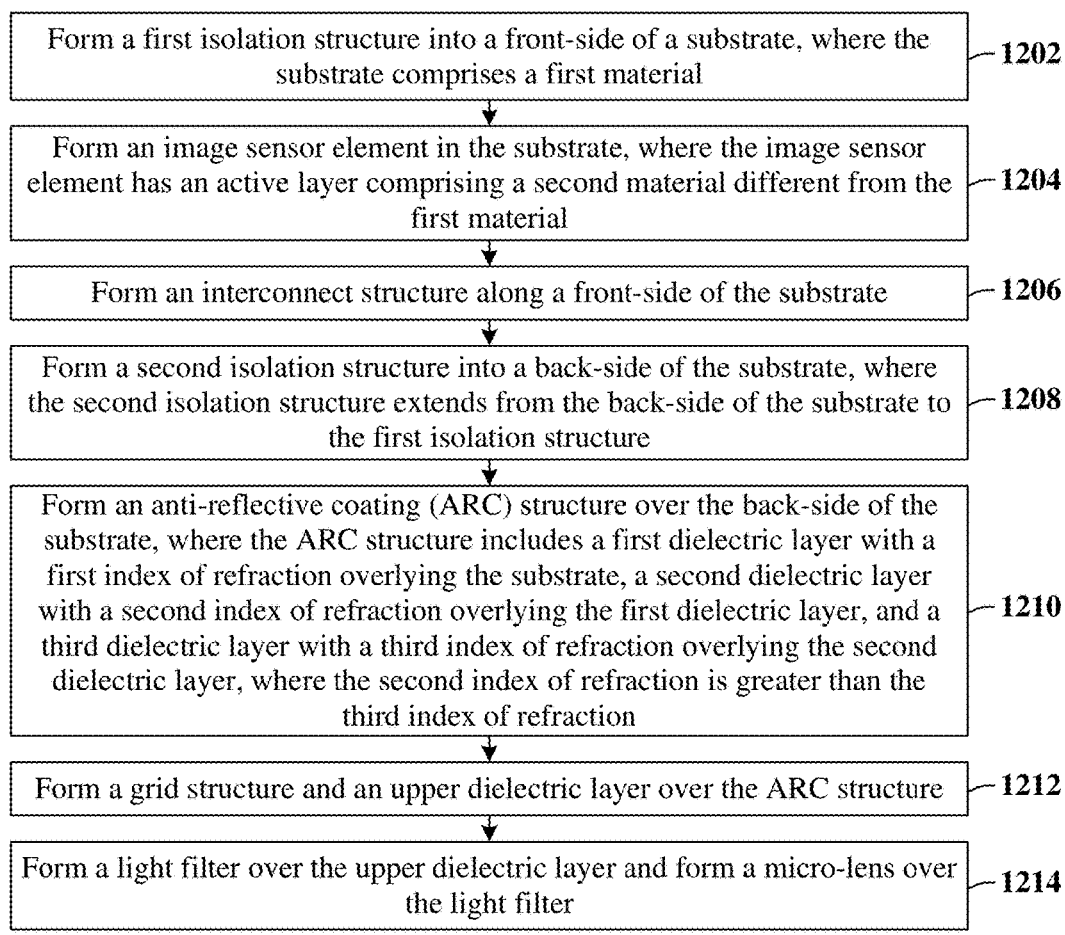
FIG. 12 illustrates a methodology in flowchart format that illustrates some embodiments of forming a pixel sensor having an ARC structure overlying an image sensor element.

FIG. 12 illustrates a method 1200 of forming a pixel sensor having an anti-reflective coating (ARC) structure overlying an image sensor element according to the present disclosure. Although the method 1200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1202, a first isolation structure is formed into a front-side of a substrate, where the substrate comprises a first material. FIG. 4 illustrates a cross-sectional view 400 corresponding to some embodiments of act 1202.

At act 1204, an image sensor element is formed in the substrate, where the image sensor element has an active layer comprising a second material different from the first material. FIG. 5 illustrates a cross-sectional view 500 corresponding to some embodiments of act 1204.

At act 1206, an interconnect structure is formed along a front-side of the substrate. FIG. 6 illustrates a cross-sectional view 600 corresponding to some embodiments of act 1206.

At act 1208, a second isolation structure is formed into a back-side of the substrate, where the second isolation structure extends from the back-side of the substrate to the first isolation structure. FIGS. 7 and 8 illustrate cross-sectional views 700 and 800 corresponding to some embodiments of act 1208.

At act 1210, an anti-reflective coating (ARC) structure is formed over the back-side of the substrate. The ARC structure includes a first dielectric layer with a first index of refraction overlying the substrate, a second dielectric layer with a second index of refraction overlying the first dielectric layer, and a third dielectric layer with a third index of refraction overlying the second dielectric layer. Further, the second index of refraction is greater than the third index of refraction. FIG. 9 illustrates a cross-sectional view 900 corresponding to some embodiments of act 1210.

At act 1212, a grid structure and an upper dielectric layer are formed over the ARC structure. FIG. 10 illustrates a cross-sectional view 1000 corresponding to some embodiments of act 1212.

At act 1214, a light filter is formed over the upper dielectric layer and a micro-lens is formed over the light filter. FIG. 11 illustrates a cross-sectional view 1100 corresponding to some embodiments of act 1214.

Accordingly, in some embodiments, the present disclosure relates to an anti-reflective coating (ARC) structure overlying an image sensor element, where the ARC structure includes a first dielectric layer with a first index of refraction overlying the image sensor element, a second dielectric layer with a second index of refraction overlying the first dielectric layer, and a third dielectric layer with a third index of refraction overlying the second dielectric layer. The second index of refraction is greater than the first index of refraction and the first index of refraction is greater than the third index of refraction.

In some embodiments, the present application provides a pixel sensor including: a substrate having a front-side opposite a back-side; an image sensor element comprising an active layer disposed within the substrate, wherein the active layer comprises germanium; and an anti-reflective coating (ARC) structure overlying the back-side of the substrate, wherein the ARC structure includes a first dielectric layer overlying the back-side of the substrate, a second dielectric layer overlying the first dielectric layer, and a third dielectric layer overlying the second dielectric layer, wherein a first index of refraction of the first dielectric layer is less than a second index of refraction of the second dielectric layer, and wherein a third index of refraction of the third dielectric layer is less than the first index of refraction.

In some embodiments, the present application provides an integrated circuit (IC) including: a first IC die including a first substrate and a first interconnect structure overlying the first substrate; a second IC die overlying the first IC die, wherein the second IC die includes a second substrate and a second interconnect structure underlying the second substrate, wherein the first and second IC dies contact at a bond interface between the first and second interconnect structures; a plurality of image sensor elements disposed within the second substrate; a grid structure overlying the plurality of image sensor elements, wherein each image sensor element is spaced laterally between sidewalls of the grid structure; and an anti-reflective coating (ARC) structure disposed between the second substrate and the grid structure, wherein the ARC structure includes a first dielectric layer, a second dielectric layer, and a third dielectric layer each with an index of refraction that is different from one another, wherein the second dielectric layer overlies the first dielectric layer and the third dielectric layer overlies the second dielectric layer, and wherein the first dielectric layer comprises a first metal oxide and the second dielectric layer comprises a second metal oxide different from the first metal oxide.

In some embodiments, the present application provides a method for forming a pixel sensor, the method includes: forming a first isolation structure into a front-side of a substrate; forming an image sensor element within the substrate such that the image sensor element includes an active layer spaced laterally between sidewalls of the first isolation structure, wherein the substrate comprises a first material and the active layer comprises a second material different from the first material; forming an interconnect structure along the front-side of the substrate; and forming an anti-reflecting coating (ARC) structure over a back-side of the substrate such that the ARC structure includes a first dielectric layer overlying the back-side of the substrate, a second dielectric layer overlying the first dielectric layer, and a third dielectric layer overlying the second dielectric layer, wherein a first index of refraction of the first dielectric layer is less than a second index of refraction of the second dielectric layer, and wherein a third index of refraction of the third dielectric layer is less than the first index of refraction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a pixel sensor, the method comprising:
    forming a first isolation structure into a front-side of a substrate;
    forming an image sensor element within the substrate such that the image sensor element includes an active layer spaced laterally between sidewalls of the first isolation structure, wherein the substrate comprises a first material and the active layer comprises a second material different from the first material;
    forming an interconnect structure along the front-side of the substrate; and
    forming an anti-reflecting coating (ARC) structure over a back-side of the substrate such that the ARC structure comprises a first dielectric layer overlying the back-side of the substrate, a second dielectric layer overlying the first dielectric layer, and a third dielectric layer overlying the second dielectric layer, wherein a first index of refraction of the first dielectric layer is less than a second index of refraction of the second dielectric layer, wherein a third index of refraction of the third dielectric layer is less than the first index of refraction, wherein a first thickness of the first dielectric layer is greater than a second thickness of the second dielectric layer, wherein a third thickness of the third dielectric layer is greater than the first thickness, and wherein the first dielectric layer directly contacts the second dielectric layer and the second dielectric layer directly contacts the third dielectric layer.

2. The method of claim 1, wherein forming the image sensor element includes:
    patterning the front-side of the substrate to form an opening that extends into the front-side of the substrate;
    depositing the second material within the opening; and
    performing a planarization process on the second material, thereby forming the active layer.

3. The method of claim 1, further comprising:
    patterning the back-side of the substrate to form an opening that extends into the back-side of the substrate;
    depositing a passivation layer over the substrate such that the passivation layer lines the opening, wherein the passivation layer continuously extends along the back-side of the substrate and is disposed between the back-side of the substrate and the first dielectric layer, wherein a thickness of the passivation layer is less than the second thickness; and
    forming a conductive trench layer within the opening such that the passivation layer is disposed between the conductive trench layer and the substrate.

4. The method of claim 3, wherein an index of refraction of the passivation layer is less than the first index of refraction and the second index of refraction.

5. The method of claim 1, wherein the first dielectric layer, the second dielectric layer, and the third dielectric layer each comprise a dielectric material different from one another.

6. The method of claim 1, wherein the first material is silicon and the second material is germanium.

7. The method of claim 1, further comprising:
forming a grid structure over the ARC structure;
forming a light filter over the ARC structure; and
forming a micro-lens on the light filter.

8. The method of claim 1, wherein the interconnect structure comprises an interconnect dielectric structure and a reflector disposed within the interconnect dielectric structure, wherein the reflector is laterally aligned with the image sensor element and has a width greater than a width of the active layer.

9. A method for forming an integrated circuit (IC), the method comprising:
forming an image sensor element into a front-side surface of a substrate, wherein the substrate has a back-side surface opposite the front-side surface;
etching the back-side surface of the substrate to form an opening extending into the back-side surface;
depositing a passivation layer over the substrate and lining the opening, wherein the passivation layer continuously laterally extends along the back-side surface;
forming a conductive trench layer within the opening;
depositing a first dielectric layer on the passivation layer and over the image sensor element, wherein the passivation layer vertically separates a bottom surface of the first dielectric layer from the back-side surface;
depositing a second dielectric layer on the first dielectric layer, wherein a first index of refraction of the first dielectric layer is less than a second index of refraction of the second dielectric layer; and
depositing a third dielectric layer on the second dielectric layer, wherein a third index of refraction of the third dielectric layer and a fourth index of refraction of the passivation layer are less than the first index of refraction.

10. The method of claim 9, wherein the first dielectric layer comprises a first metal oxide and the second dielectric layer comprises a second metal oxide different from the first metal oxide.

11. The method of claim 10, wherein the first metal oxide is tantalum oxide, the second metal oxide is titanium oxide, and the third dielectric layer comprises silicon dioxide.

12. The method of claim 9, further comprising:
forming a first isolation structure extending into the front-side surface of the substrate, wherein the first isolation structure comprises a first isolation segment laterally offset from a second isolation segment, wherein the image sensor element is spaced laterally between the first and second isolation segments, and wherein the first, second, and third dielectric layers each continuously laterally extend from over the first isolation segment to over the second isolation segment.

13. The method of claim 9, wherein forming the image sensor element comprises:
forming an active layer extending into the front-side surface of the substrate, wherein the active layer comprises a material different from that of the substrate; and
performing one or more ion implantation process(es) to from a first heavily doped region abutting a first well region within the active layer, wherein the first well region comprises a first doping type and the first heavily doped region comprises a second doping type opposite the first doping type.

14. A method for forming an integrated circuit (IC), the method comprising:
forming an image sensor element comprising an active layer within a substrate, wherein the substrate comprises a front-side surface opposite a back-side surface;
forming an interconnect structure along the front-side surface, wherein the interconnect structure comprises a reflector under the image sensor element and a plurality of conductive wires, wherein the plurality of conductive wires comprises a first level of conductive wires having a shortest vertical distance to the front-side surface, wherein the reflector is disposed between the first level of conductive wires and the front-side surface, wherein a width of the reflector is greater than a width of the active layer;
forming a back-side isolation structure extending into the back-side surface of the substrate, wherein the image sensor element is spaced between opposing sidewalls of the back-side isolation structure; and
forming an anti-reflective coating (ARC) structure over the substrate and the back-side isolation structure, wherein an index of refraction of the ARC structure discretely changes at least two times from a top surface of the ARC structure in a direction towards the image sensor element, wherein the image sensor element is spaced laterally between opposing sidewalls of the ARC structure.

15. The method of claim 14, forming the ARC structure comprises:
depositing a first dielectric layer on the substrate;
depositing a second dielectric layer on the first dielectric layer, wherein a first index of refraction of the first dielectric layer is less than a second index of refraction of the second dielectric layer; and
depositing a third dielectric layer on the second dielectric layer, wherein a third index of refraction of the third dielectric layer is less than the second index of refraction.

16. The method of claim 15, wherein the first index of refraction is within a range of about 2 to 2.16, the second index of refraction is within a range of about 2.4 to 2.6, and the third index of refraction is less than about 1.65.

17. The method of claim 15, further comprising:
forming a grid structure directly contacting the third dielectric layer, wherein the grid structure comprises opposing sidewalls defining an opening above the image sensor element.

18. The method of claim 17, further comprising:
forming an upper dielectric layer over the ARC structure and within the opening, wherein the upper dielectric layer directly contacts the third dielectric layer, and wherein an index of refraction of the upper dielectric layer is less than the first index of refraction.

19. The method of claim 18, wherein a height of the upper dielectric layer is greater than a height of the ARC structure.

20. The method of claim 14, wherein the reflector comprises a conductive material different from that of the plurality of conductive wires.

* * * * *